United States Patent [19]

Suzuki

[11] Patent Number: 4,943,766
[45] Date of Patent: Jul. 24, 1990

[54] ELECTRIC QUANTITY DETECTING METHOD

[75] Inventor: Sunao Suzuki, Hyogo, Japan

[73] Assignee: Mitsubishi Denki Kabushiki Kaisha, Tokyo, Japan

[21] Appl. No.: 363,166

[22] Filed: Jun. 8, 1989

[30] Foreign Application Priority Data

Nov. 16, 1988 [JP] Japan ................................. 63-290701

[51] Int. Cl.$^5$ ........................ G01R 29/00; H02H 3/00
[52] U.S. Cl. .................................... 324/132; 324/111; 361/86; 361/94
[58] Field of Search ................. 324/132, 111; 364/483, 364/481; 361/80, 94, 96, 86

[56] References Cited

U.S. PATENT DOCUMENTS

| 4,672,501 | 6/1987 | Bilac et al. | 364/483 |
| 4,774,621 | 9/1988 | Andow | 364/483 |
| 4,885,656 | 12/1989 | Suzuki et al. | 361/86 |

Primary Examiner—Reinhard J. Eisenzopf
Assistant Examiner—Vinh P. Nguyen
Attorney, Agent, or Firm—Bernard, Rothwell & Brown

[57] ABSTRACT

A method of detecting amplitude value of AC electric quantity in electric power system, where five sampling values obtained in sampling performed in sequence at a period of ¼ of the period of the rated frequency of the AC electric quantity are used, and the first through fifth sampling values are squared respectively and the squared values of the second and fourth sampling values are multiplied by four and the squared value of the third sampling value is multiplied by six and the sum total of these values is obtained, and then the sum total is divided by eight and its square root is estimated, thereby the amplitude value of the AC electric quantity is obtained. Even if the frequency of the AC electric quantity to be detected is varied about ±5%, its amplitude value can be operated with good accuracy and the operation result can be obtained at high speed.

3 Claims, 4 Drawing Sheets

ELECTRIC QUANTITY DETECTING METHOD

BACKGROUND OF THE INVENTION

1. Field of the Invention

The present invention relates to methods of detecting of amplitude values of electric quantities such as alternating voltage, alternating current or the like in electric systems, and more particularly to a detecting method where the frequency characteristics of a quantity to be detected are improved so as to obtain the amplitude value with little error.

2. Description of the Prior Art

FIG. 1 is a diagram explaining the principle of a prior art digital processing device for AC electric quantity measurement, disclosed in Japanese patent application No. 333434/1987, where sampling is performed every 90° of alternating current and its amplitude value is estimated using three data samples. In FIG. 1, assuming that present sampling value 1 is made i (0), sampling value 2 preceding the present value by one period (T) is made i (T) and sampling value 3 preceding the present value by two periods (2T) is made i (2T), respective sampling values 1-3 are squared in square operation steps 6-8, and the result of only the square operation step 7 is doubled in a twice operation step 32.

Results obtained in the square operation steps 6 and 8 and the twice operation step 32 are added in adding operation step 14 so as to obtain the sum total. If the sum total is divided by two in a dividing operation step 33 and its square root is estimated in a square root operation step 16, its output $F_n$ is obtained at a terminal 17 and becomes the amplitude value of the alternating current.

Next, operation will be described. For convenience of explanation, the AC eletric quantity shall be alternating current, and its maximum value is made I, instantaneous value i is made $i = I \sin\theta$, fundamental frequency is made $f_0$, and sampling period is $\frac{1}{4}$ of the period of the fundamental frequency $f_0$ and made T. In order to distinguish data per sampling time, nT (n=0, 1, 2, ..., and n=0 donates the present time) is used as a suffix, and i is expressed as i (0), i (T), i (2T), ...

This is expressed by following formula (1).

$$F_n = \left[ \frac{I}{2} \{i^2(0) + 2i^2(T) + i^2(2T)\} \right]^{\frac{1}{2}} \quad (1)$$

$$= \left[ \frac{I}{2} I^2 \{\sin^2(\theta) + 2\sin^2(\theta - T) + \sin^2(\theta - 2T)\} \right]^{\frac{1}{2}}$$

$$= I \left[ 1 - \frac{1}{2} \{1 + \cos(2T)\} \cdot \cos(2\theta - 2T) \right]^{\frac{1}{2}}$$

$$= I [1 - \cos^2(T) \cdot \cos(2\theta - 2T)]^{\frac{1}{2}}$$

$$\therefore F_n = I [1 - \cos^2(T) \cdot \cos(2\theta - 2T)]^{\frac{1}{2}}$$

The sampling period T is fixed to $\frac{1}{4}$ period with respect to the fundamental frequency $f_0$ of the alternating current, i.e., the time interval corresponding to 90° in electric angle. If the frequency is f, the sampling period T is expressed by following formula (2).

$$T = \frac{f}{f_0 \times 4} \times 360° \quad (2)$$

For example, if frequency of the alternating current $f = f_0 = 50$ Hz, the sampling period becomes T=90°.

In general when the electric power system is operated at the rated frequency $f_0$, formula (1) becomes $F_n = I$ and amplitude value operation of the current is possible and this is utilized, for example, in an AC overcurrent protective relay, a control device or the like. However, for a protective relay to detect faults in the electric power system and a control device for detecting electric quantities to control operating facilities, the frequency of the electric power system is often varied from $f_0$, and the amplitude value must be estimated accurately even if the frequency is slightly shifted. In ordinary cases, the amplitude value measurement error must be reduced as much as possible to accommodate variation of the frequency of about ±5 %.

If the frequency becomes f=52.5 Hz (5% increase of 50 Hz ), the sampling period becomes T=94.5° and substituting this in formula (1), $F_n$ becomes $$F_n = I\{1 - 0.0062 \cos(2\theta - 189°)\}^{\frac{1}{2}} \quad (3)$$

in form that an oscillation waveform of twice the frequency is superposed with constant value. Since cos $(2\theta - 189°)$ can be varied in range of +1.0 to −1.0, formula (3) becomes $$F_n = 0.997I \text{ to } 1.003I \quad (1)$$

thereby error of −0.3% to +0.3% is produced in comparison to the amplitude value measurement operating in the case of the rated frequency 50 Hz.

Since the electric quantity detecting method in the prior art is costituted by each operating step as above described and performs the amplitude value operation, a problem exists in that the amplitude value operation error is relatively large when the frequency varies about ±5%.

SUMMARY OF THE INVENTION

An object of the invention is to provide an electric quantity detecting method wherein only two additional sampling value are used in comparison to the prior art thereby even if the frequency is varied the amplitude value operation error can be reduced.

Another object of the invention is to provide an electric quantity detecting method wherein relatively few sampling values are used by only adding two values in comparison to the prior art and the complicated operation processing step is not required and therefore high speed operation processing becomes possible.

The foregoing and other objects and novel features of the invention will more fully appear from the following detailed description when the same is read in connection with the accompanying drawings. It is to be expressly understood, however, that the drawings are for purpose of illustration only and is not intended as a definition of the limits of the invention.

In the electric quantity detecting method according to the invention, five sampling values are used and the first-fifth sampling values are squared respectively, and at the same time the square values of the second and fourth sampling values are multiplied by four and the square value of the third sampling value is multiplied by six, and then the sum total of these values is obtained in each operation processing, thereby the amplitude value is measured.

Consequently, in amplitude value measurement operation of the electric quantity detecting method according to the invention, sampling values as few as five are used and the operation result can be obtained at high speed, and even if the frequency is varied the operation is performed with high accuracy, thereby performance of a digital protective relay or a control device can be significantly improved.

DETAILED DESCRIPTION OF THE PREFERRED EMBODIMENTS

An embodiment of the invention will now be described in the case of sampling the current in electric power system referring to the accompanying drawings.

Figure 1:
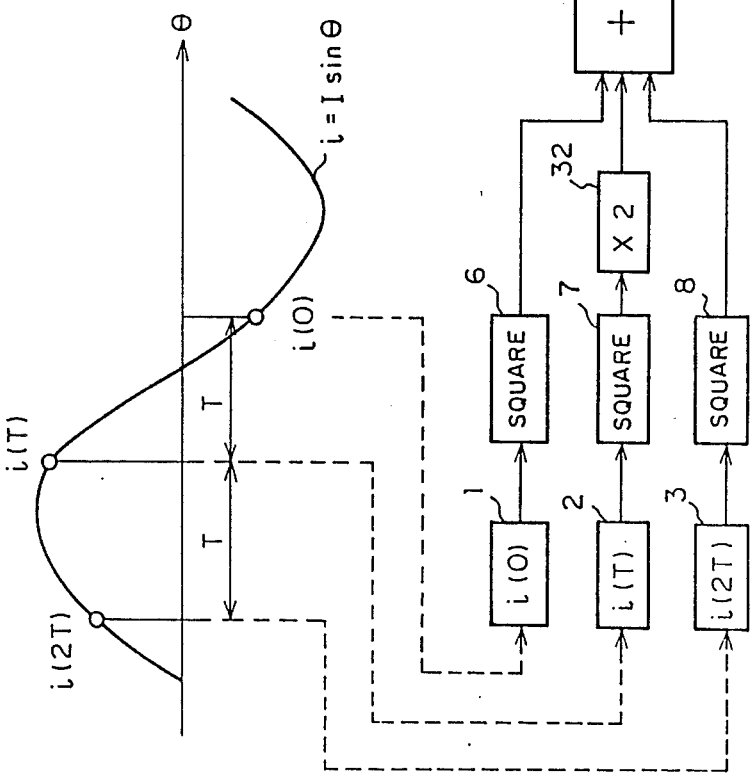
FIG. 1 is a block diagram illustrating an amplitude value operating method in the prior art.
Figure 2:
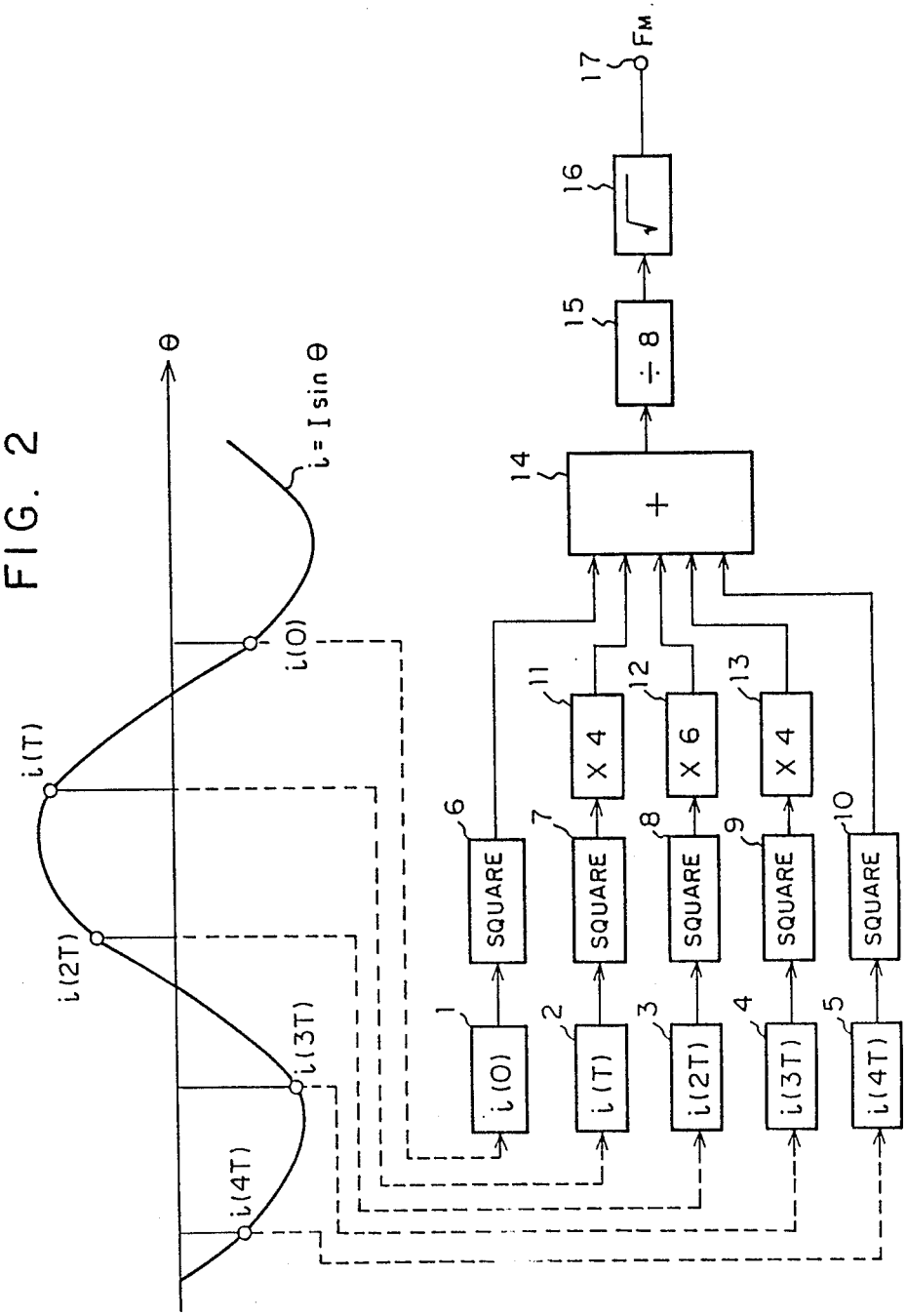
FIG. 2 is a block diagram illustrating the principle of an amplitude value operating method as an embodiment of the invention.

In FIG. 2, sampling values 1–5 in the time t- nT (n=0, 1, 2, 3, 4) apart from the present sampling time t by the prescribed sampling number n are made i (0), i (T), i(2T), i (3T), i (4T), the respective sampling values 1–5 ar squared in square operation steps 6–10, results in the square operation steps 7 and 9 are multiplied by four in four-times operation steps 11 and the 13 and result in the square operation step 8 is multiplied by six in six-times operation step 12.

The results obtained in the square operation steps 6 and 10 the four-times operation steps 11 and 13 and the six-times operation step 12 are added in adding operation step 14 thereby the sum total is obtained. The sum total is divided by eight in dividing operation step 15 and its square root is estimated in square root operation step 16. The result is obtained as amplitude value output $F_n$ a terminal 17.

This is expressed by following formula (5), and further by substituting the sampling instantaneous value and transforming the formula (5), following formula (6) is obtained.

$$F_n = \left[ \frac{1}{8} [i(0)^2 + 4\{i(T)^2 + i(3T)^2\} + 6i(2T)^2 + i(4T)^2] \right]^{\frac{1}{2}} \tag{5}$$

$$= \left[ \frac{1}{8} I^2 [\sin^2(\theta) + 4\{\sin^2(\theta - T) + \sin^2(\theta - 3T)\} + 6\sin^2(\theta - 2T) + \sin^2(\theta - 4T)] \right]^{\frac{1}{2}}$$

$$= \left[ \frac{1}{16} I^2 [1 - \cos(2\theta) + 4\{1 - \cos2(\theta - T) + 1 - \cos2(\theta - 3T)\} + 6\{1 - \cos2(\theta - 2T)\} + 1 - \cos2(\theta - 4T)] \right]^{\frac{1}{2}}$$

$$= \left[ \frac{1}{16} I^2 [16 - 2\cos(4T)\cos2(\theta - 2T) - 8\cos(2T)\cos2(\theta - 2T) - 6\cos2(\theta - 2T)] \right]^{\frac{1}{2}}$$

$$= \left[ \frac{1}{16} I^2 [16 - 2\{3 + 4\cos(2T) + \cos(4T)\} \cdot \cos2(\theta - 2T)] \right]^{\frac{1}{2}}$$

$$= \left[ \frac{1}{16} I^2 [16 - 2\{2 + 4\cos(2T) + 2\cos^2(2T)\} \cdot \cos2(\theta - 2T)] \right]^{\frac{1}{2}}$$

$$= \left[ \frac{1}{16} I^2 [16 - 4\{1 + \cos(2T)\}^2 \cdot \cos2(\theta - 2T)] \right]^{\frac{1}{2}}$$

$$= \left[ \frac{1}{16} I^2 [16 - 16\cos^4(T) \cdot \cos2(\theta - 2T)] \right]^{\frac{1}{2}}$$

$$= I [1 - \cos^4(T) \cdot \cos2(\theta - 2T)]^{\frac{1}{2}} \tag{6}$$

If the frequency becomes f=52.5 Hz (5% increase of 50 Hz), the sampling period becomes T=94.5° and substituting this in formular (6), $F_n$ bocomes $$F_n = I[1 - \cos^4(94.5°) \cdot \cos(2\theta - 2 \times 94.5°)]^{\frac{1}{2}} \tag{7}$$
$$= I[1 - 3.79 \times 10^{-5} \cos(2\theta - 189°)]^{\frac{1}{2}}$$

in form that an oscillation waveform of amplitude $3.79 \times 10^5$ I and twice frequency is superposed with I. Since $\cos(2\theta - 189°)$ can be varied in range of ±1.0 it follows that $$F_n = 0.99998I \text{ to } 1.00002I \tag{8}$$

thereby error of −0.002% to +0.002% is produced and becomes very small value in comparison to the amplitude value operation measurement in the case of the rated frequency 50 Hz.

A digital protective relay compares the amplitude value operation result $F_n$ thus obtained with a prescribed value (also called a set value) by a comparison means (not shown) and detects faults of the electric power system, and a control device utilizes the obtained $F_n$ switching control of a static capacitor or the like although not shown.

In the above description, although the output of the adding operating step 14 is processed in the dividing operation step 15 and the square root operation step 16, if setting is performed to the squared value of the prescribed value (set value) of the digital protective relay or the control device, the square root operation step 16 may be eliminated, and if setting is performed to a value equal to the prescribed value (set value) squared and multiplied by eight, the dividing operation step 15 and the square root operation step 16 may be eliminated. Also in the embodiment, althought the outputs of the square operation steps 7, 9 are multiplied by four in the four-time operation steps 11, 13 respectively, a similar result can be obtained, of course, by known change of the operation rule such that the sum of the square operation steps 7, 9 is estimated and multiplied by four, and this is contemplated in the invention.

Variation states of the amplitude value operation result $F_n$ in the case of varying the frequancy will now be described referring to FIG. 3.

If the ratio of the frequency f after the variation to the rated frequency $f_0$ is represented by $$m = \frac{f}{f_0},$$

following formula (9) is obtained from formula (2) and formula (6).

$$F_n = I[1 - \cos^4(T) \cdot \cos(2\theta - 2T)]^{\frac{1}{2}} \quad (9)$$
$$= I[1 - \cos^4(90° m) \cdot \cos(2\theta - 2 \times 90° m)]^{\frac{1}{2}}$$

Figure 3:
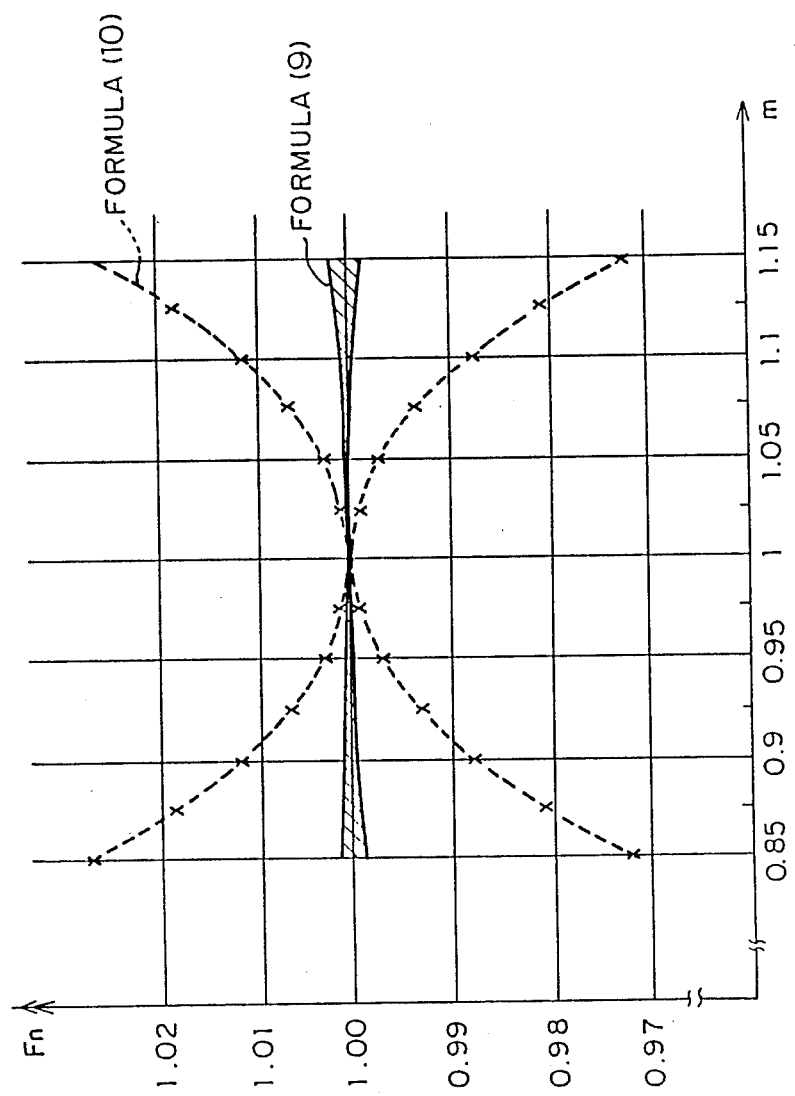
FIG. 3 is a diagram illustrating frequency characteristics of an amplitude value operation result obtained by operating the method, of the prior art and the present invention.

If m in the formula (9) is varied as shown in the figure the hatched portion in FIG. 3 can be obtained, and it is seen that variation of $F_n$ becomes small in the vicinity of m=1 (f=$f_0$) and error of the amplitude value operation result becomes minimum.

Also if formula (1) in the prior art is expressed using m, following formula (10) is obtained and shown by dotted line in FIG. 3. It is clearly seen that the error in the operation processing according to the invention is much smaller than the error produced by the prior art method.

$$F_n = I[1 - \cos^2(90°m) \cdot \cos(2\theta - 2 \times 90°m)]^{\frac{1}{2}} \quad (10)$$

Since the sampling values used in the amplitude value operation including the sampling value in the present time can be realized by five sampling values, the result can be obtained in the time corresponding to 90°×5=450°, thereby a high speed operation can be realized, scarcely varying in comparison to the prior art, and also the memory amount required for the calculation processing can be realized scarcely varying from the memory requirements of the prior art.

Figure 4:
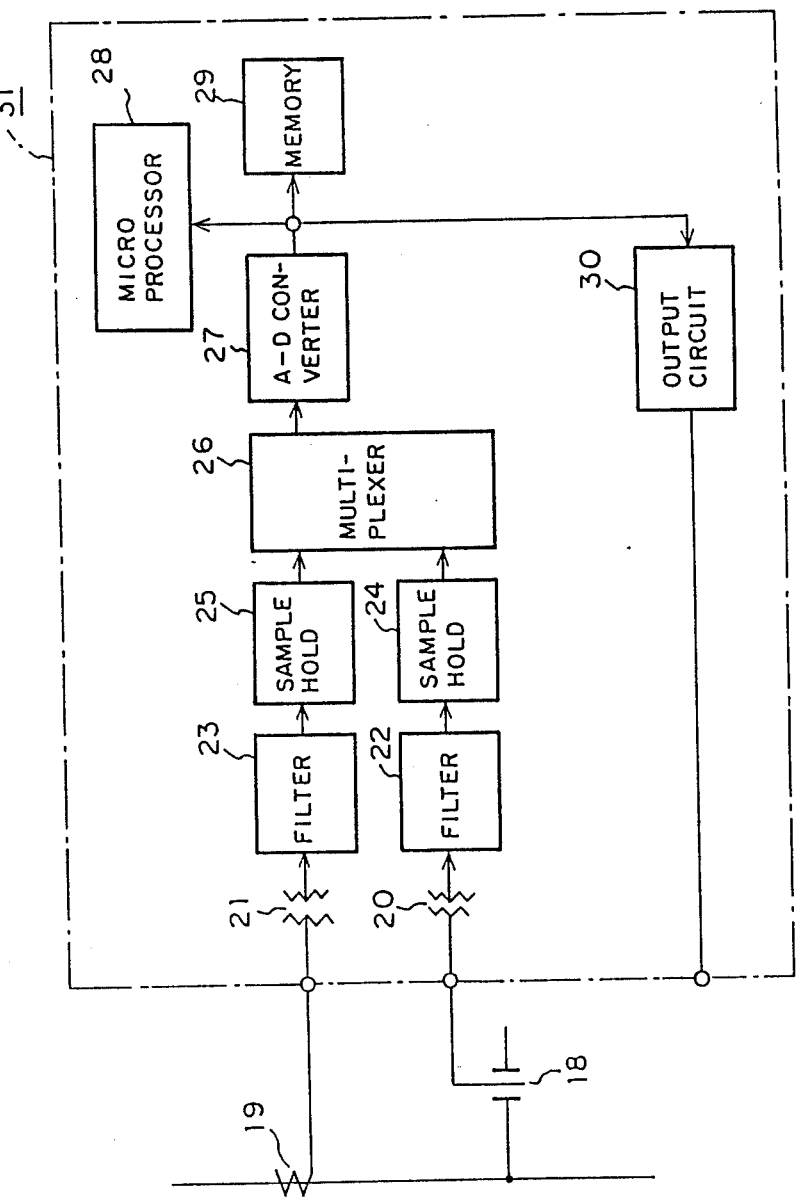
FIG. 4 is a block diagram illustrating the hardware constitution of an electric quantity detector to realize the operating method of the invention.

FIG. 4 is a hardware constitution diagram of an electric quantity detector 31 realizing the amplitude value operation. In FIG. 4, numeral 18 designates a voltage potential transformer, numeral 19 designates a current transformer, numerals 20, 21 designate input converters which convert voltage and current of the electric power system into values to be easily processed, and numerals 22, 23 designate filters which eleminate add multiple harmonic frequencies of the sampling frequency as well known. Numerals 24, 25 designate sample hold circuits which hold the sampling values to the next sampling period. Numeral 26 designates a multiplexer which alternates outputs from the sample hold circuits 24, 25 in sequence and transmits them to an A-D converter 27. Numeral 28 designates a microprocessor which executes operations utilizing a program previously stored in a memory 29 and outputs the result to an output circuit 30.

In the embodiment, although the description is given for the case of estimating the amplitude value of alternating current, similar effect can be obtained also when the alternating current is phase current, line current of the electric power system, or a sysmmetrical component obtained from the phase current and the line current, i.e., positive-phase-sequence current, negative-phased-sequence current or zero-phase-sequence current, and similarly for case of alternating voltage. If formular (5) is expressed as a general formula including these parameters the amplitude value Y becomes $$Y = [\tfrac{1}{8} \cdot [y(0)^2 + 4 \cdot \{y(T)^2 + y(3T)^2\} + 6 \cdot y(2T)^2 + y(4T)^2]]^{\frac{1}{2}}$$

As above described, according to the electric quantity detecting method of the invention, five sampling values are used continuously and each sampling value is squared, and the second and fourth squared values are multiplied by four, the third squared value is multipled by six and the sum total is obtained. Since the amplitude value is operated through each operation processing, even if frequency characteristics of the AC electric quantity are varied about ±5%, the amplitude value can be operated with good accuracy and the operation result can be obtained at high speed.

What is claimed is:

1. An electric quantity detecting method comprising the steps of:
sampling an AC electric quantity of an electric system at a period T equal to $\tfrac{1}{4}$ of the period of the rated frequency of said AC electric quantity and obtaining a sampling value;
converting said sampling value from an analog value into a digital value; and
performing operation processing based on the digitized sampling value and detecting the amplitude value of the AC electric quantity of said electric power system,
wherein said sampling values are given as y(t), y(t−T), y(t−2T), y(t−3T), y(t−4T) obtained in said sampling step at times t−nT (n=0, 1, 2, 3, 4) apart from the present sampling time t by the prescribed sampling number n, and the operation processing in the operation processing step is performed in accordance with the following formula $$Y = [\tfrac{1}{8} \cdot [y(0)^2 + 4 \cdot \{y(T)^2 + y(3T)^2\} + 6 \cdot y(2T)^2 + y(4T)^2]]^{\frac{1}{2}}$$

and the amplitude value Y of the AC electric quantity is detected.

2. The electric quantity detecting method as set forth in claim 1, wherein said AC electric quantity in the electric system is any one among phase current, line current of the electric power system or respective positive-phase-sequence current, negative-phase-sequence current, or zero-phase-sequence current obtained from each of the phase current and the line current.

3. The electric detecting method as set forth in claim 1, wherein said AC electric quantity in the electric system is any one among phase voltage, line voltage of the electric power system respective positive-phase-sequence voltage, negative-phase-sequence voltage, or zero-phase-sequence voltage obtained from each of the phase voltage and the line voltage.

* * * * *

UNITED STATES PATENT AND TRADEMARK OFFICE
CERTIFICATE OF CORRECTION

PATENT NO. : 4,943,766
DATED : July 24, 1990
INVENTOR(S) : SUNAO SUZUKI

It is certified that error appears in the above-identified patent and that said Letters Patent is hereby corrected as shown below:

Column 1, line 7, delete "of";
         line 37, "eletric" should be --electric--.

Column 2, line 31, "operating" should be --operation--;
         line 43, "value" should be --values--.

Column 3, line 51, delete the comma ",";
         line 51, "method" should be --methods--;
         line 60, before "electric" insert --an--;
         line 66, "ar" should be --are--;
         line 68, delete "the" and before "result" insert --the--.

Column 4, line 4, after "10" insert --,--;
         line 6, after "14" insert --,--;
         line 10, after "$F_n$" insert --in--;
         line 49, "formular" should be --formula--;
         line 49, "boçomes" should be --becomes--;
         line 56, "$10^5$" should be --$10^{-5}$--.

UNITED STATES PATENT AND TRADEMARK OFFICE
CERTIFICATE OF CORRECTION

PATENT NO. : 4,943,766

DATED : July 24, 1990

INVENTOR(S) : SUNAO SUZUKI

Page 2 of 2

It is certified that error appears in the above-identified patent and that said Letters Patent is hereby corrected as shown below:

Column 5, line 3, after "$F_n$" insert --in;
        line 68, "eleminate" should be --eliminate--;
\*       line 68, "add" should be --odd--.

Column 6, line 16, "sysmmetrical" should be --symmetrical--;
        line 20, after "for" insert --the--;
        line 21, "formular" should be --formula--.

Column 7, line 3, after "electric" insert --quantity--.

Signed and Sealed this

Third Day of December, 1991

Attest:

HARRY F. MANBECK, JR.

*Attesting Officer*      *Commissioner of Patents and Trademarks*